United States Patent
Chuang et al.

(10) Patent No.: US 7,492,628 B2
(45) Date of Patent: *Feb. 17, 2009

(54) COMPUTER-READABLE MEDIUM ENCODING A MEMORY USING A BACK-GATE CONTROLLED ASYMMETRICAL MEMORY CELL

(75) Inventors: Ching-Te Chuang, South Salem, NY (US); Jae-Joon Kim, Yorktown Heights, NY (US); Keunwoo Kim, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/933,505

(22) Filed: Nov. 1, 2007

(65) Prior Publication Data

US 2008/0084733 A1   Apr. 10, 2008

Related U.S. Application Data

(63) Continuation of application No. 11/362,613, filed on Feb. 27, 2006, now Pat. No. 7,313,012.

(51) Int. Cl.
*G11C 11/00* (2006.01)
(52) U.S. Cl. .................. 365/154; 365/155; 365/156; 365/203
(58) Field of Classification Search ............ 365/154, 365/155, 156, 203, 189.08, 294
See application file for complete search history.

(56) References Cited

U.S. PATENT DOCUMENTS

| 5,673,230 A | 9/1997 | Kuriyama | 365/203 |
| 5,986,924 A * | 11/1999 | Yamada | 365/154 |
| 6,198,656 B1 | 3/2001 | Zhang | 365/154 |

(Continued)

OTHER PUBLICATIONS

Chuang et al., "Independent-Gate Controlled Asymmetrical Memory Cell and Memory Using the Cell," U.s. Appl. No. 11/362,612, filed Feb. 27, 2006.

(Continued)

*Primary Examiner*—Richard Elms
*Assistant Examiner*—Toan Le
(74) *Attorney, Agent, or Firm*—Ryan, Mason & Lewis, LLP (57) ABSTRACT

Techniques are provided for a computer-readable medium encoding a memory using a back-gate controlled asymmetrical memory cell. In one aspect, the cell includes five transistors and can be employed for static random access memory (SRAM) applications. An encoded inventive memory circuit can include a plurality of bit line structures, a plurality of word line structures that intersect the plurality of bit line structures to form a plurality of cell locations, and a plurality of cells located at the plurality of cell locations. Each cell can be selectively coupled to a corresponding one of the bit line structures under control of a corresponding one of the word line structures. Each cell can include a first inverter having first and second field effect transistors (FETS) and a second inverter with third and fourth FETS that is cross-coupled to the first inverter to form a storage flip-flop. One of the FETS in the first inverter can be configured with independent front and back gates and can function as both an access transistor and part of one of the inverters.

5 Claims, 6 Drawing Sheets

U.S. PATENT DOCUMENTS

| | | | | |
|---|---|---|---|---|
| 6,573,549 | B1 * | 6/2003 | Deng et al. | 257/296 |
| 6,831,483 | B2 | 12/2004 | Shimazaki et al. | |
| 7,177,177 | B2 * | 2/2007 | Chuang et al. | 365/154 |
| 7,200,030 | B2 * | 4/2007 | Yamaoka et al. | 365/154 |
| 7,313,012 | B2 * | 12/2007 | Chuang et al. | 365/154 |
| 2003/0035331 | A1 * | 2/2003 | Foss et al. | 365/200 |

OTHER PUBLICATIONS

Chuang et al., "Asymmetrical Memory Cells and Memories Using the Cells," U.S. Appl. No. 11/392,071, filed Mar. 29, 2006.

Kuriyama et al., "An Asymmetric Memory Cell using a C-TFT for ULSO SRAMs," Symposium on VLSI Technology Digest of Technical Papers, pp. 38-39 (1992).

Itabashi et al., "A Split Wordline Cell for 16Mb SRAM Using Polysilicon Sidewall Contacts," IEEE, IEDM 91 (1991).

"Taurus-Medici: Industry—standard device simulation tool," Synopsys Data Sheet (2003).

Shang et al., "Mobility and CMOS Devices/Circuits on sub-10nm (110) Ultra Thin Body SOI," Symposium on VLSI Technology Digest of Technical Papers, pp. 78-79 (2005).

Kim et al., "Performance assessment of scaled strained-Si channel-on-insulator (SSOI) CMOS," Solid-State Electronics 48, pp. 239-243 (2004).

Takeda et al., "A Read-Static-Noise-Margin-Free SRAM Cell for Low-$V_{dd}$ and High-Speed Applications," IEEE International Solid-State Circuits Conference, pp. 478-479, 611 (2005).

Azizi et al., "Low-Leakage Asymmetric-Cell SRAM," IEEE Transactions on Very Large Scale Integration (VLSI) Systems, vol. 11, No. 4, pp. 701-715 (Aug. 2003).

Guo et al., "FinFET-Based SRAM Design," ISLPED (Aug. 8-10, 2005).

Yamaoka et al., "Low Power SRAM Menu for SOC Application Using Yin-Yang-Feedback Memory Cell Technology," Symposium on VLSI Circuits Digest of Technical Papers, pp. 288-291 (2004).

* cited by examiner

COMPUTER-READABLE MEDIUM ENCODING A MEMORY USING A BACK-GATE CONTROLLED ASYMMETRICAL MEMORY CELL

CROSS-REFERENCE TO RELATED APPLICATIONS

This application is a continuation, under 37 CFR 1 53(b), of co-assigned U.S. patent application Ser. No. 11/362,613 of inventors Chuang et al, now U.S. Pat. No. 7,313,012, and claims the benefit thereof, said application No. 11/362,613 having been filed on Feb. 27, 2006, and entitled "Back-Gate Controlled Asymmetrical Memory Cell And Memory Using The Cell." The complete disclosure of the aforesaid application No. 11/362,613, now U.S. Pat. No. 7,313,012, is expressly incorporated herein by reference in its entirety for all purposes.

STATEMENT REGARDING FEDERALLY SPONSORED RESEARCH OR DEVELOPMENT

This invention was made with Government support under contract number NBCH 3039004 awarded by the Defense Advanced Research Projects Agency (DARPA). The government has certain rights in this invention.

FIELD OF THE INVENTION

The present invention generally relates to electronic circuitry and, more particularly, to electronic memory circuits.

BACKGROUND OF THE INVENTION

As device size substantially shrinks in advanced very large scale integration (VLSI) technology, increased process variation causes significant amounts of threshold voltage fluctuation. As a result, stability of static random access memory (SRAM) deteriorates due to large threshold voltage mismatches between two neighboring transistors in a cell. The well-known conventional six transistor SRAM is described, e.g., in Hodges & Jackson's textbook "Analysis and Design of Integrated Circuits," 2d edition, at pages 364-68 (N.Y., McGraw Hill, 1988). The conventional SRAM has its worst stability during the READ mode because the voltage at the storage node having a "zero" logic value rises during the READ cycle. If this increased node voltage is larger than the trip voltage of the inverter, the stored logic values will be flipped and data will be lost.

U.S. Pat. No. 6,198,656 to Zhang discloses an asymmetric memory cell for single-ended sensing. An apparatus including an asymmetrical memory cell having a first inverter and a second inverter is provided. The first inverter is larger than said second inverter.

U.S. Pat. No. 5,673,230 to Kuriyama discloses a semiconductor memory device capable of operating at high speed and stably even under low power supply voltage. A memory cell includes a read/write word line R/WL1 driving an access transistor Q1 in read and write operations and a write word line WL1 driving an access transistor Q2 in the write operation. In the write operation, both access transistors Q1 and Q2 are driven, and storage information is written in the memory cell by a bit line and a complementary bit line having potentials complementary to each other. On the other hand, in the read operation, only access transistor Q1 is rendered conductive, and storage information is read out through the bit line. Since access transistor Q2 is rendered nonconductive, a P type TFT transistor and an N type transistor operate as a complementary metal oxide semiconductor (CMOS) type inverter having a large voltage gain. Therefore, a sufficient operating margin is secured even in the read operation.

While the so-called asymmetrical SRAM cell can achieve an improved static noise margin (SNM) as compared to a conventional symmetrical SRAM cell, there are practical limits, due to device size considerations, to obtain further improvement in the SNM.

It would be desirable to overcome the limitations in previous approaches.

SUMMARY OF THE INVENTION

Principles of the present invention provide techniques for a computer readable medium encoding a memory using backgate controlled asymmetrical SRAM cells. Cells according to the present invention can obtain improved read stability, and can be configured, e.g., with five instead of six transistors.

In an exemplary embodiment, according to one aspect of the invention, a computer-readable medium encodes an apparatus, and the encoded apparatus includes a plurality of bit line structures, a plurality of word line structures, and a plurality of cells. The plurality of word line structures intersect the plurality of bit line structures to form a plurality of cell locations. The cells are located at the plurality of cell locations, and each cell is selectively coupled to a corresponding one of the bit line structures under control of a corresponding one of the word line structures. Each of the cells includes a first inverter having first and second field effect transistors (FETS) and a second inverter having third and fourth FETS. The second inverter is cross-coupled to the first inverter to form a storage flip-flop. The second FET is configured with independent front and back gates. One of the gates of the second FET is configured to aid the selective coupling, while the other of the gates is configured for cross-coupling with the second inverter. Stated in another way, a single FET with two independently controlled gates forms both an access transistor and part of one of the inverters.

In accordance with a further aspect of the invention, a computer-readable medium encodes an apparatus, and the encoded apparatus includes a plurality of bit line structures, a plurality of word line structures, and a plurality of cells. The plurality of word line structures intersect the plurality of bit line structures to form a plurality of cell locations. The cells are located at the plurality of cell locations. Each of the cells includes a first field effect transistor (FET) of a first type, the first FET having a first drain-source terminal, a second drain-source terminal, and a gate; a second FET of the first type, the second FET having a first drain-source terminal, a second drain-source terminal, and a gate; a third FET of a second type, the third FET having a first drain-source terminal coupled to the second drain-source terminal of the second FET and the gate of the first FET to form a node Q, a second drain-source terminal, and a gate coupled to the gate of the second FET and the second drain-source terminal of the first FET to form a node Qb; a fourth FET having a first drain-source terminal connected to the node Q, a second drain-source terminal, and a gate; and a fifth FET having a first drain-source terminal connected to the node Qb, a second drain-source terminal, a front gate, and a back gate, independent of the front gate, and connected to the node Q. Each of the cells is selectively coupled to a corresponding one of the bit line structures via the fourth and fifth FETS, under control of a corresponding one of the word line structures acting on at least one of the front gate of the fifth FET and the gate of the fourth FET.

One or more embodiments of the present invention may be employed in the fabrication of an integrated circuit.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

Figure 1:
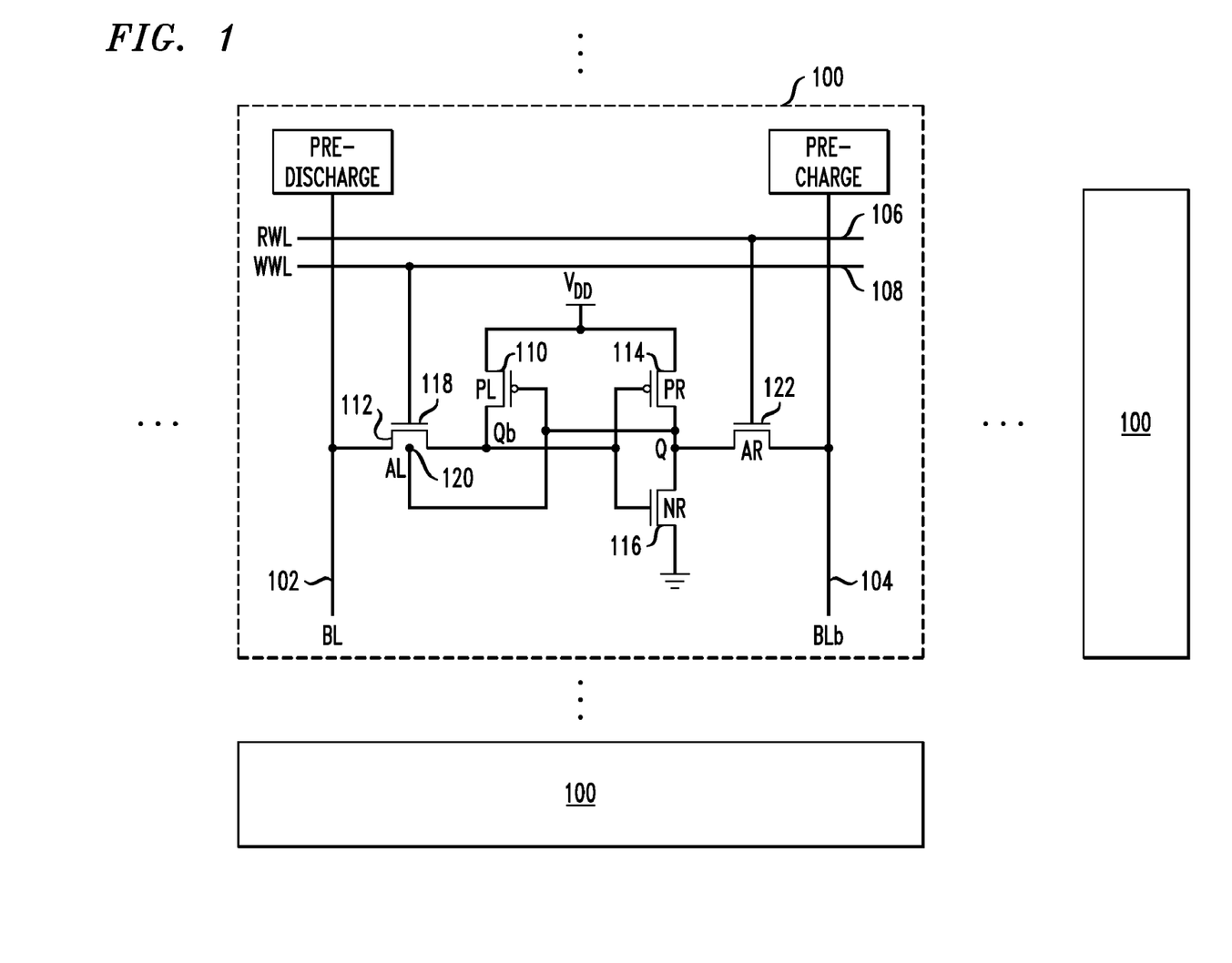
FIG. 1 shows an exemplary embodiment of a memory with a five transistor back-gate controlled asymmetrical static random access memory (SRAM) cell according to one aspect of the present invention.

FIG. 1 depicts a memory, such as an SRAM, employing asymmetrical SRAM cells in accordance with an exemplary embodiment of the present invention. It will be appreciated that asymmetrical cells 100 are part of the larger memory circuit having a plurality of bit line structures, such as those formed by true and complementary bit lines 102, 104. Such bit lines are also referred to as "BL" and "BLb." Further, the circuit also includes a plurality of word line structures, such as those formed by read and write word lines 106, 108 (also referred to as "RWL" and "WWL" respectively) that intersect the plurality of bit line structures to form a plurality of cell locations. For illustrative convenience, only a single cell 100 is depicted in detail FIG. 1, the other cells being shown in block form. The skilled artisan will appreciate that a memory circuit can be provided, for example, in the form of an integrated circuit, having many such cells, as illustrated by the ellipses. In the exemplary embodiment, each of the cells 100 is asymmetrical, that is, there is not symmetry between the left and right portions of the cell 100. Of course, a circuit could be provided with some cells of the type shown and some cells of a different type, either conventional or according to other embodiments of the present invention.

A plurality of cells 100 can be located at the plurality of cell locations. Each of the cells 100 can be selectively coupled to a corresponding one of the bit line structures formed by true and complementary bit lines 102, 104 under control of a corresponding one of the word line structures formed by read and write word lines 106, 108. Each of the cells can include a first inverter having first and second FETS 110, 112 respectively. Furthermore, each cell can have a second inverter with third and fourth FETS 114, 116 respectively. The second inverter formed by transistors 114, 116 can be cross-coupled to the first inverter formed by transistors 110, 112 to form a storage flip-flop.

The second FET 112 can be configured with independent front and back gates 118, 120. As used herein, gates are separately or independently biased when they are not permanently tied together, such that they are capable of being maintained at different voltages. One of the gates can be configured to aid the selective coupling, while another can be configured for the cross-coupling with the second inverter. In the exemplary embodiment depicted in FIG. 1, the front gate 118 of second FET 112 is configured to aid the selective coupling, while the back gate 120 of second FET 112 is configured for cross-coupling with the second inverter formed by transistors 114, 116. Stated in another way, in the exemplary embodiment shown in FIG. 1, the front gate 118 of transistor 112 is configured to provide the standard access function, while the back gate 120 of transistor 112 allows transistor 112 to independently function as part of an inverter, together with transistor 110, forming the aforementioned flip-flop when cross-coupled to the inverter formed by FETS 114, 116. A fifth FET 122 can be provided to function as a conventional access transistor. First through fifth FETS 110, 112, 114, 116, 122 are also designated, respectively, as PL, AL, PR, NR, and AR. In this terminology, "L" refers to left-side, "R" refers to right-side, "P" refers to a P-type transistor, "N" refers to an N-type transistor, and "A" refers to an access transistor.

In general terms, it will be appreciated that transistors 110, 114 can be of a first type, while transistor 116 can be of a second type, as can transistors 112, 122. In the exemplary embodiment depicted in FIG. 1, the first type is P-type, while the second type is N-type. However, the skilled artisan will appreciate that a circuit can be constructed using different types of transistors with different polarities.

It will be appreciated that each of the FETS has first and second drain-source terminals. Transistor 112, as noted, has independent front and back gates 118, 120. In the exemplary embodiment depicted in FIG. 1, the remaining transistors can each have a single gate formed, for example, by tying front and back gates together, and a first drain-source terminal of FET 110 can be maintained at supply voltage $V_{DD}$, while a second drain-source terminal of FET 110 can be connected to a first drain-source terminal of transistor 112, to form node Qb. FET 114 can have a first drain-source terminal maintained at the supply voltage, and a second drain-source terminal coupled to a first drain-source terminal of FET 116, forming a node Q. As shown in FIG. 1, the second drain-source terminal of transistor 116 can be grounded. Node Q can be coupled to the gate of transistor 110 as well as the back gate 120 of transistor 112. Node Qb can be coupled to the gates of transistors 114, 116. Transistor 122, and transistor 112 acting under the control of front gate 118, provide selective coupling of the cell 100 to the true and complementary bit lines 102, 104 forming a corresponding bit line structure. This occurs under the control of read and write word lines 106, 108. In the exemplary embodiment of FIG. 1, write word line 108 controls the front gate 118 of transistor 112, while read word line 106 controls the gate of transistor 122.

By way of review and further detail, it will be appreciated that the transistors 110, 114, 116, 122 may have single gates, which can be formed, for example, by front and back gates that are tied together. Furthermore, it will be appreciated that the aforementioned bit line structures can include paired true and complementary bit lines 102, 104, while the word line structures can include paired read and write word lines 106, 108. The aforementioned selective coupling can be achieved as shown in FIG. 1. The first drain-source terminal of FET 122 can be connected to node Q, while the second drain-source terminal of FET 122 can be interconnected with a corresponding complementary bit line 104, and the gate of transistor 122 can be interconnected with corresponding read word line 106. The second drain-source terminal of FET 112 can be interconnected with a corresponding one of the true bit lines 102, while the front gate 118 of FET 112 can be interconnected with a corresponding one of the write word lines 108. As noted, FETS 112, 122 can be of the second type, like FET 116, which in the example shown in FIG. 1 is the N-type. Again, the first type can be the P-type.

As indicated in FIG. 1, the true bit lines 102 can be configured to be pre-discharged to a relatively low voltage, such as ground, while the complimentary bit lines 104 can be configured to be pre-charged to a relatively high supply voltage, for example $V_{DD}$.

As noted, the second drain-source terminal of FET 116 can be grounded, while the first drain-source terminal of FET 110 and the first drain-source terminal of FET 114 can be interconnected and maintained at the relatively high supply voltage, for example, $V_{DD}$.

In the exemplary embodiment depicted in FIG. 1, FET 112 can be configured and dimensioned such that in a stand-by mode where node Q is in a logical "high" state and node Qb is in a logical "low" state, the back gate 120 of the FET 112 is substantially at a voltage value corresponding to the "high" state. Under such conditions, the drain-source current through FET 112 can be higher than the drain-source current through FET 110 due to a forward-biased back gate voltage in FET 112.

Furthermore, FET 112 can be configured and dimensioned such that in a stand-by mode where node Q is in a logical "low" state and node Qb is in a logical "high" state, the back gate 120 of FET 112 is substantially at a voltage value corresponding to the "low" state, and thus the drain-source current through FET 112 is a relatively small leakage current consistent with reliability and low stand-by power.

In one aspect of the exemplary embodiment depicted in FIG. 1, FET 112 can have a device width that is substantially equal to that of the left-hand NFET in a comparable six-transistor SRAM cell. As used herein, a "comparable six-transistor SRAM cell" includes a six-transistor cell according to well-known prior techniques such as are discussed in tile "Background of the Invention," e.g., in the Hodges and Jackson reference. Such a cell is "comparable" to an inventive cell disclosed herein when fabricated on a similar scale using a similar technology family. It will be appreciated that the left-hand NFET in a traditional symmetrical cell as depicted in Hodges and Jackson is one of two identical NFETS of two identical inverters in such a traditional cell. An asymmetrical six-transistor cell not employing techniques of the present invention is discussed below with regard to FIG. 4.

It will be appreciated that FET 112, under control of back gate 120, together with FET 110 forms a first inverter, while FETS 114, 116 form a second inverter. In the exemplary embodiment depicted in FIG. 1, the first inverter has a trip voltage that is higher than the trip voltage of a left-hand inverter in a comparable conventional six transistor SRAM cell.

By way of review, in the exemplary embodiment depicted in FIG. 1, an N-type metal oxide semiconductor (NMOS) evaluation transistor (NL) in an asymmetrical 6T SRAM is removed and the back-gate node of the pass-transistor AL is connected to the node Q. The transistor AL in the proposed scheme plays the dual roles of AL and NL in the 6T asymmetrical SRAM. In addition, BL is pre-discharged to a low supply voltage (such as ground (GND)) and BLb is pre-charged to a high supply voltage (such as $V_{DD}$).

Figure 2:
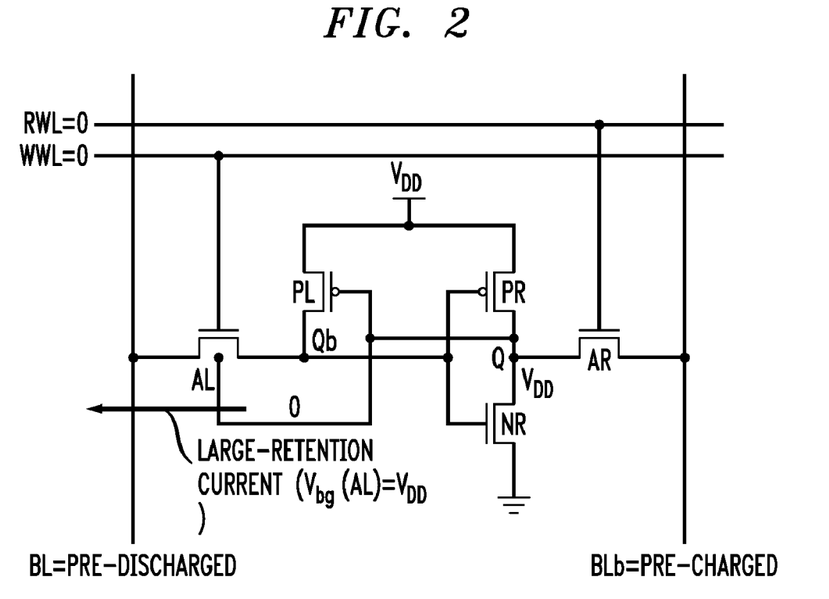
FIG. 2 shows a first operating state of the circuit of FIG. 1 in a stand-by mode.

In stand-by mode, there are two possible cases for data (1: Q=high, Qb=low, 2: Q=low, Qb=high). Let us first explain the case in FIG. 2 ($V_Q=V_{DD}$ and $V_{Qb}=$GND). If Q is a logical high, then Qb must retain a logical low value. In such a case, the back-gate voltage of AL is high because it is connected to the node Q. Hence, the current through AL is much higher than the current through PL due to the forward biased back-gate voltage, hence lower threshold voltage:

$$I_{ds}(\text{NMOS})@V_{fg}=0, V_{bg}=V_{DD} >> I_{ds}(\text{PMOS}) \\ @V_{fg}=V_{DD}, V_{bg}=V_{DD} \qquad (1)$$

Figure 3:
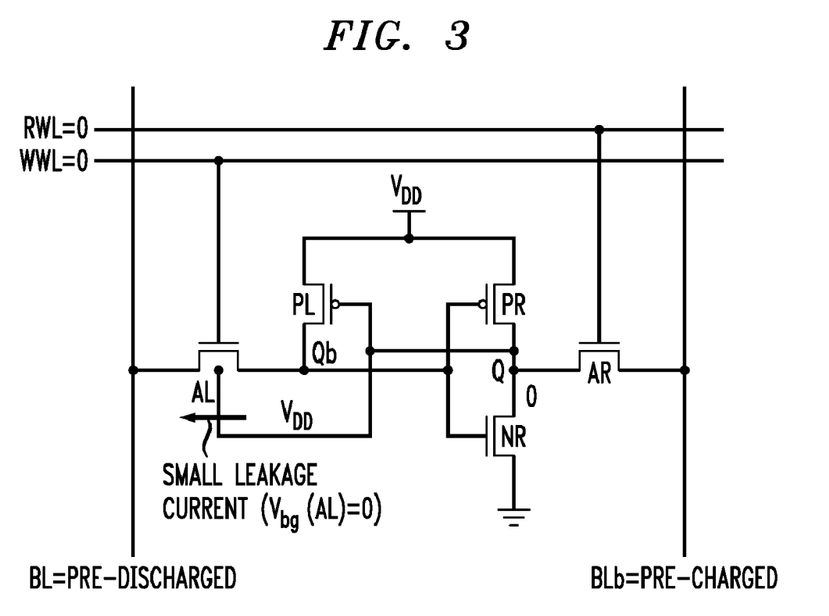
FIG. 3 shows a second operating state of the circuit of FIG. 1 in a stand-by mode.

As a result, a logical low value of Qb can be retained in the stand-by mode. On the other hand, it is preferred to have low leakage current through AL when $V_{Qb}=V_{DD}$ as in FIG. 3, for reliability and low stand-by power. In the exemplary embodiment, $V_{bg}(AL)=$GND when ($V_{Qb}=V_{DD}$ and $V_Q=$GND) so that the leakage current through AL is very small. Based on the two cases in FIGS. 2 and 3, we can conclude that a robust stand-by mode can be achieved in the exemplary embodiment.

Figure 4:
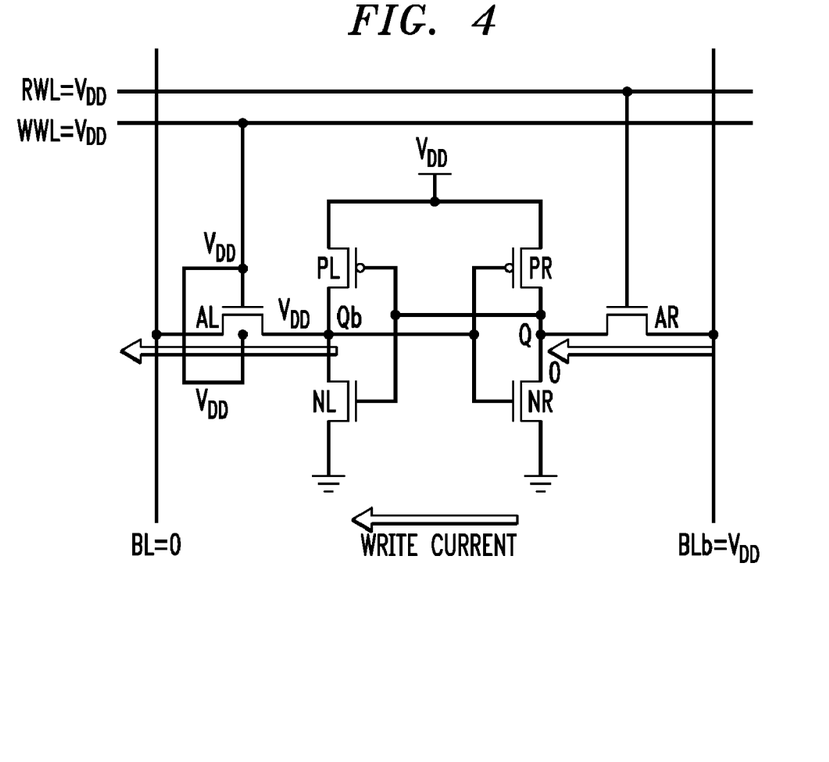
FIG. 4 shows an asymmetrical six-transistor SRAM cell not employing techniques of the present invention.
Figure 5:
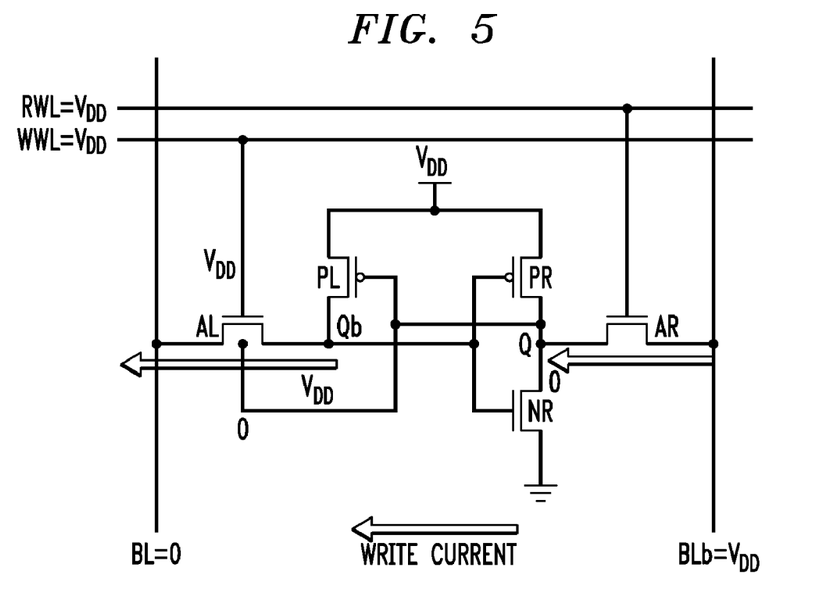
FIG. 5 shows a condition where a "zero" is being written to the Qb node in the circuit of FIG. 1.

Operating principles of the exemplary embodiment in READ and WRITE mode are the same as in asymmetrical SRAM cells not employing techniques of the present invention (such a cell is shown in FIG. 4). In the READ operation, RWL=$V_{DD}$, WWL=ground. During the WRITE operation, RWL=WWL=$V_{DD}$. In other words, the read word line RWL is "on" during both the WRITE and READ operations; it may thus be thought of as a "R/WWL" (read/write word line). Because the transistor sizes of AR/NR in the exemplary embodiment and the 6T cell shown in FIG. 4 are the same, the READ delay should be the same in both schemes. In the WRITE case, WRITE delays through transistor AR are the same in both schemes since AR/PR sizes are the same. WRITE delays through transistor AL can be different in both cases because the size and back-gate connection of AL can be different. For reliable data retention in stand-by mode, device width of AL in the exemplary embodiment is increased to be the same as the size of NL in the 6T scheme of FIG. 4. So the WRITE current is increased. On the other hand, in case of writing "0" to node Qb through AL in the exemplary embodiment, the back-gate voltage of AL is GND (See FIG. 5), while the back-gate voltage of AL in the conventional scheme is $V_{DD}$, as shown in FIG. 4. Hence, the on-current through AL in the exemplary embodiment is reduced.

It is believed that the increased size (2x~2.5x) and decreased on-current (0.4x~0.5x) compensate each other so the overall WRITE delay is likely to be comparable in both the exemplary embodiment and the 6T case.

Figure 6:
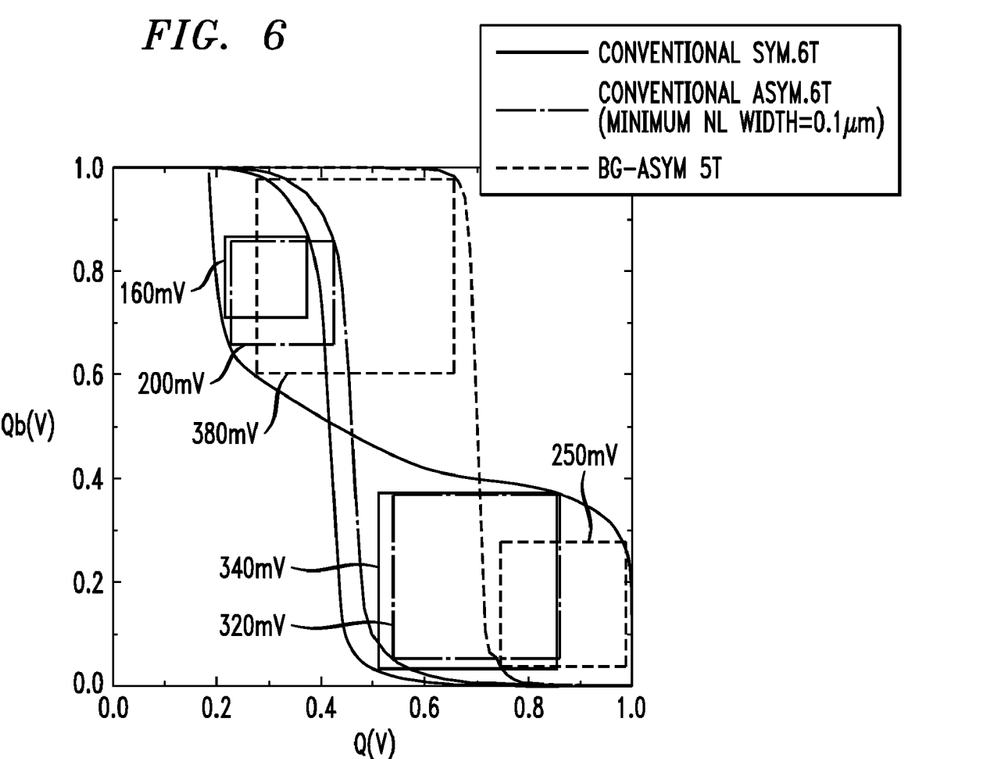
FIG. 6 shows a comparison of static noise margin (SNM) between symmetrical and asymmetrical cells not employing techniques of the present invention and a cell using the techniques of FIG. 1.

In FIG. 6 we can observe that the exemplary embodiment has the largest READ SNM compared with the symmetrical 6T cell and asymmetrical 6T cell with minimum NL width. In the exemplary embodiment, the READ stability is improved since the strength of transistor AL, with its back-gate at GND, is much weaker than the minimum width transistor strength in the asymmetrical 6T SRAM so that the trip voltage of inverter PL-AL becomes higher.

In spite of the improved SNM in the exemplary embodiment, the observation that the Right SNM is smaller than Left SNM in the exemplary embodiment of FIG. 1 indicates that the strength of AL may become too weak in some circumstances, so that the trip voltage of the PL-AL pair is unnecessarily (or excessively) high. Thus, in some applications, it may be desirable to reduce the trip voltage of the inverter formed by the PL-AL pair. One possible manner of accomplishing this is to employ the exemplary scheme depicted in FIG. 7.

Figure 7:
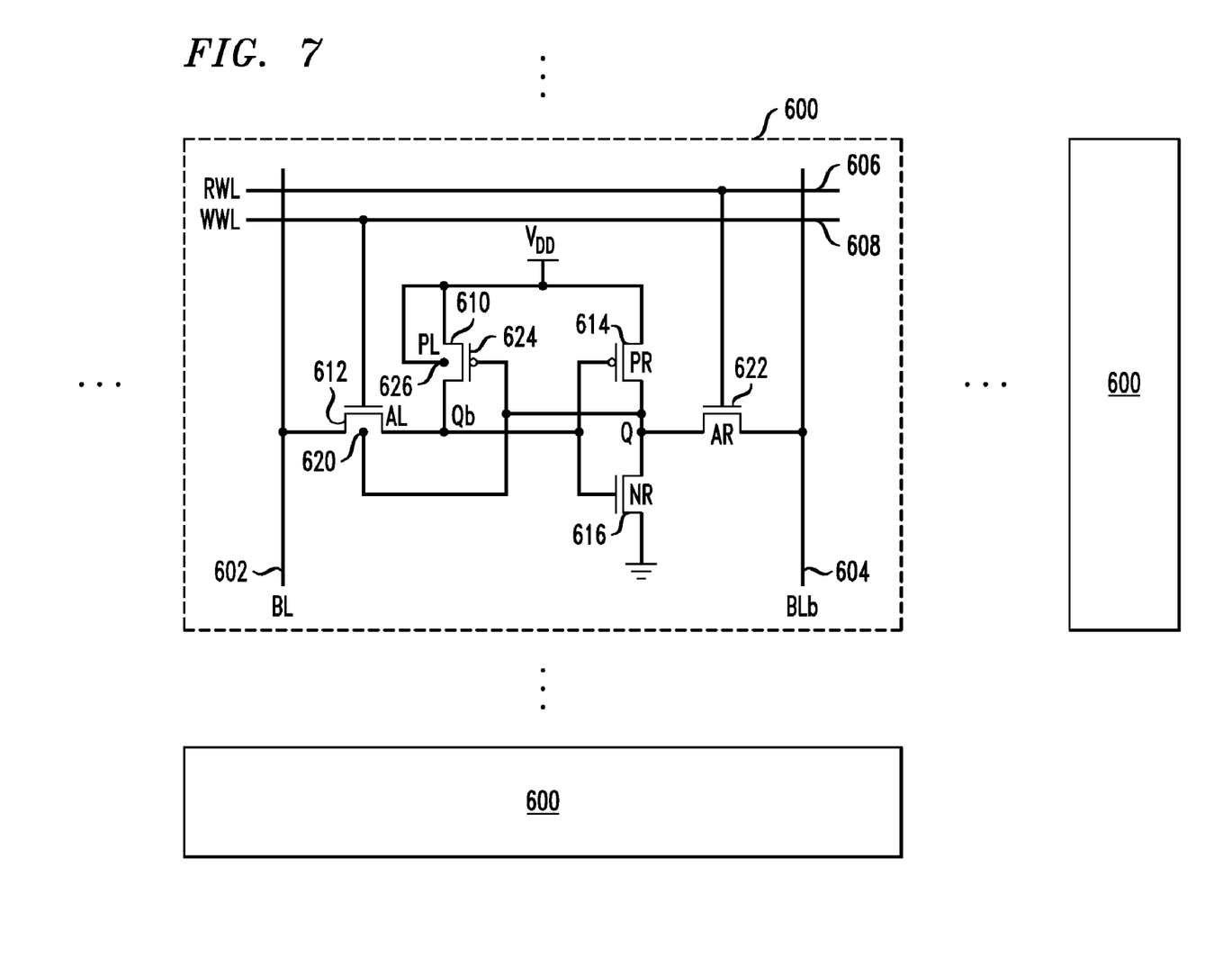
FIG. 7 shows an exemplary embodiment of a memory according to another aspect of the present invention.

The comments about the circuit made with respect to FIG. 1 are equally applicable to FIG. 7. Items similar to those in FIG. 1 have received the same reference character incremented by 500, and will not be described again. Thus, the exemplary embodiment of FIG. 7 is similar to that of FIG. 1, except for certain differences in the construction of transistor 610. In particular, transistor 610 is formed with a front gate 624 and a back gate 626 that is independent of the front gate 624. The back gate 626 of the FET 610 is interconnected with the first drain-source terminal of FET 610, which in turn can be maintained at a supply voltage such as $V_{DD}$. In the exemplary embodiment depicted in FIG. 7, the remaining transistors 614, 616, 622 can have single gates that can be formed, for example, by front and back gates tied together. It will be appreciated that the first drain-source terminal of FET 614 can also be maintained at the supply voltage. The "on" current of FET 610 is reduced compared to an otherwise comparable scheme where the first FET 610 does not have an independent back gate. This reduced "on" current can improve "WRITE" performance and can reduce the trip voltage of the inverter formed by FETS 610 and 612, thus resulting in improved hold stability (or worst-case stability). As noted, FETS 610 and 612 form an inverter, which will be referred to herein as the first inverter, while FETS 614 and 616 form a second inverter as described above with respect to FIG. 1. The trip voltage of the first inverter formed by FETS 610, 612 is lower than in a comparable scheme wherein FET 610 does not have an independent back gate.

Figure 8:
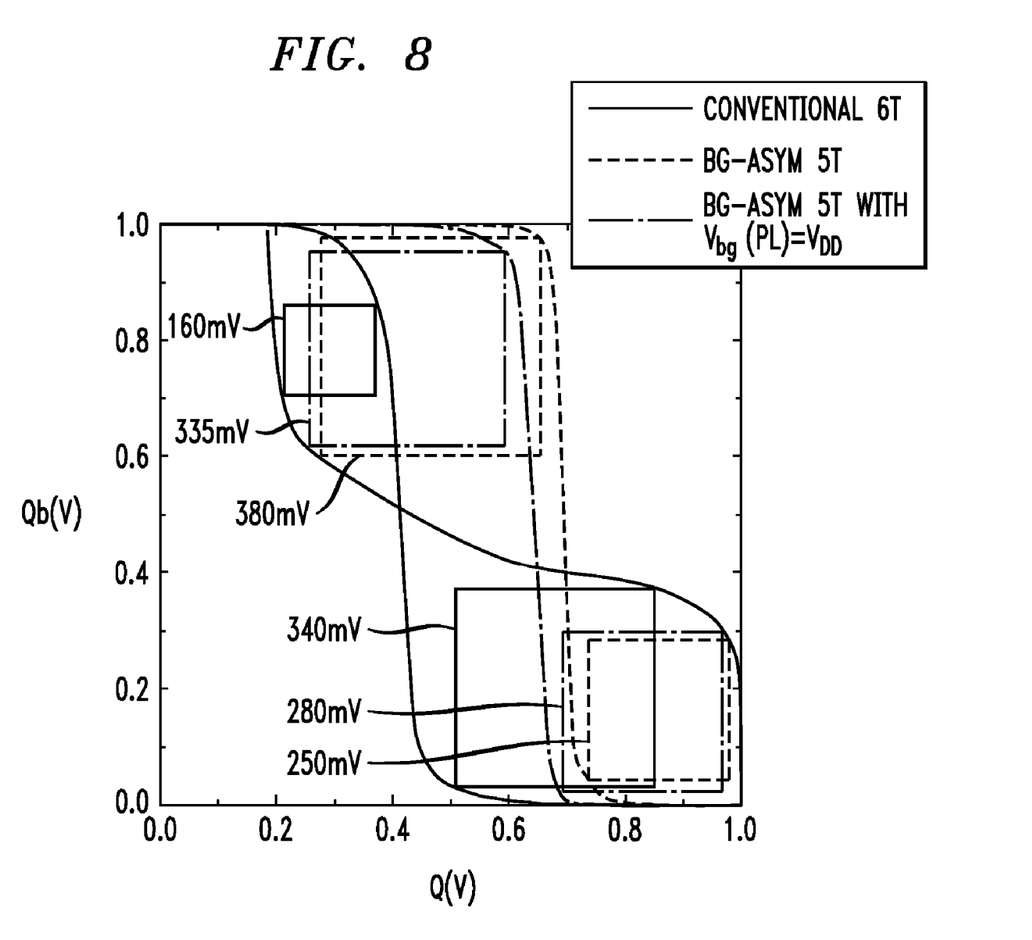
FIG. 8 shows a comparison of SNM among a symmetrical six transistor cell not employing techniques of the present invention, a cell using the techniques depicted in FIG. 1, and a cell using the techniques depicted in FIG. 7.

Thus, tile exemplary alternative embodiment of FIG. 7 can be employed to reduce the trip voltage of the PL-AL pair, where, by way of review, everything is essentially the same as in FIG. 1 except that the back-gate of PL is tied to $V_{DD}$ so that the on-current of PL is reduced and the trip voltage of the PL-AL inverter becomes lower than in FIG. 1. As a result, the SNM of the alternative exemplary embodiment of FIG. 7 is 30 mV higher than the exemplary embodiment of FIG. 1 due to the properly lowered trip-voltage of PL-NL pair, as depicted in FIG. 8. It is worthwhile to note that the weaker PL can also improve the WRITE performance.

It will be appreciated that the present invention contemplates individual memory cells, as well as a number of such cells collocated as described herein to form a memory circuit. The cells can be SRAM cells and the memory circuit formed can be an SRAM. The transistors employed can be metal oxide semiconductor field effect transistors (MOSFETS) and the polarities in terms of P-type and N-type can be as shown herein, or can be reversed.

It will be appreciated that one or more exemplary embodiments of the present invention can provide greater stability than conventional six transistor SRAM cells. Furthermore, one or more exemplary embodiments of the present invention can provide greater stability than asymmetrical six transistor SRAM cells, even those employing enhanced transistor sizing. Yet further, one or more exemplary embodiments of the present invention may occupy a smaller area than symmetrical six transistor SRAM cells and asymmetrical six transistors SRAM cells, due to the smaller number of transistors needed in the cell. Techniques of the present invention can be advantageously employed in a variety of applications. One application that may particularly benefit from techniques of the present invention is future scaled technologies where stability is difficult to manage due to process variations.

Memory cells according to one more aspects of the present invention may be formed into memory circuits, which may be realized as integrated circuits; thus, at least a portion of the techniques of one or more aspects or embodiments of the present invention described herein may be implemented in an integrated circuit. In forming integrated circuits, a plurality of identical die are typically fabricated in a repeated pattern on a surface of a semiconductor wafer. Each die can include one or more of the cells described herein, and may include other structures or circuits, or other types of cells. The individual die are cut or diced from the wafer, then packaged as an integrated circuit. A person of skill in the art will know how to dice wafers and package die to produce integrated circuits. Integrated circuits so manufactured are considered part of the present invention. Circuits including cells as described above can be part of the design for an integrated circuit chip. The chip design can be created, for example, in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design can then be converted into an appropriate format such as, for example, Graphic Design System II (GDSII), for the fabrication of photolithographic masks, which typically include multiple copies of the chip design in question that are to be formed on a wafer. The photolithographic masks can be utilized to define areas of the wafer (and/or the layers thereon) to be etched or otherwise processed.

Resulting integrated circuit chips can be distributed by the fabricator in raw wafer form (that is, as a single wafer that has multiple unpackaged chips), as a bare die or in a packaged form. In the latter case, the chip can be mounted in a single chip package (such as a plastic carrier, with leads that are affixed to a mother board or other higher level carrier) or in a multi-chip package (such as a ceramic carrier that has either or both surface interconnections or buried interconnections). In any case, the chip may then be integrated with other chips, discrete circuit elements and/or other signal processing devices as part of either (a) an intermediate product, such as a mother board, or (b) an end product. The end product can be any product that includes integrated circuit chips, ranging from toys and other low-end applications to advanced computer products having a display, a keyboard or other input device, and a central processor.

It will be appreciated and should be understood that the exemplary embodiments of the invention described above can be implemented in a number of different fashions. Given the teachings of the invention provided herein, one of ordinary skill in the related art will be able to contemplate other implementations of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope of spirit of the invention.

What is claimed is:

1. A computer-readable medium encoding an apparatus, the encoded apparatus comprising:
   a plurality of bit line structures;
   a plurality of word lines structures intersecting said plurality of bit line structures to form a plurality of cell locations;

a plurality of cells located at said plurality of cell locations, each of said cells being selectively coupled to a corresponding one of said bit line structures under control of a corresponding one of said word line structures, each of said cells in turn comprising:
- a first inverter having first and second field effect transistors (FETS); and
- a second inverter having third and fourth FETS, said second inverter being cross-coupled to said first inverter to form a storage flip-flop;

wherein said second FET is configured with independent front and back gates, one of said front gate and said back gate of said second FET being configured to aid said selective coupling, another of said front gate and said back gate of said second FET being configured for said cross-coupling with said second inverter.

2. The computer-readable medium as recited in claim 1, wherein said encoded front gate of said encoded second FET is configured to aid said selective coupling, and said encoded back gate of said encoded second FET is configured for said cross-coupling with said encoded second inverter.

3. A computer-readable medium encoding an apparatus, the encoded apparatus comprising:
- a plurality of bit line structures;
- a plurality of word lines structures intersecting said plurality of bit line structures to form a plurality of cell locations;
- a plurality of cells located at said plurality of cell locations, each of said cells in turn comprising:
  - a first field effect transistor (FET) of a first type, said first FET having a first drain-source terminal, a second drain-source terminal, and a gate;
  - a second FET of said first type, said second FET having a first drain-source terminal, a second drain-source terminal, and a gate;
  - a third FET of a second type, said third FET having a first drain-source terminal coupled to said second drain-source terminal of said second FET and said gate of said first FET to form a node Q, a second drain-source terminal, and a gate coupled to said gate of said second FET and said second drain-source terminal of said first FET to form a node Qb;
  - a fourth FET having a first drain-source terminal connected to said node Q, a second drain-source terminal, and a gate; and
  - a fifth FET having a first drain-source terminal connected to said node Qb, a second drain-source terminal, a front gate, and a back gate, independent of said front gate, and connected to said node Q;

wherein each of said cells is selectively coupled to a corresponding one of said bit line structures via said fourth and fifth FETS, under control of a corresponding one of said word line structures acting on at least one of said front gate of said fifth FET and said gate of said fourth FET.

4. The computer-readable medium as recited in claim 3, wherein said encoded fifth FET is configured and dimensioned such that in a stand-by mode where said encoded node Q is in a logical "high" state and said encoded node Qb is in a logical "low" state, said encoded back gate of said encoded fifth FET is substantially at a voltage value corresponding to said "high" state, and a drain-source current through said encoded fifth FET is higher than a drain-source current through said encoded first FET due to a forward-biased back gate voltage in said encoded fifth FET.

5. The computer-readable medium as recited in claim 3, wherein said encoded fifth FET is configured and dimensioned such that in a stand-by mode where said encoded node Q is in a logical "low" state and said encoded node Qb is in a logical "high" state, said encoded back gate of said encoded fifth FET is substantially at a voltage value corresponding to said "low" state, and a drain-source current through said encoded fifth FET is a relatively small leakage current consistent with reliability and low stand-by power.

* * * * *